United States Patent
Lee et al.

(10) Patent No.: US 8,526,231 B2
(45) Date of Patent: Sep. 3, 2013

(54) NON-VOLATILE MEMORY DEVICE

(75) Inventors: Yong-Kyu Lee, Gwacheon-si (KR);
Tea-Kwang Yu, Hwaseong-si (KR);
Bo-Young Seo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 175 days.

(21) Appl. No.: 13/177,873

(22) Filed: Jul. 7, 2011

(65) Prior Publication Data
US 2012/0087189 A1 Apr. 12, 2012

(30) Foreign Application Priority Data

Oct. 7, 2010 (KR) .......................... 10-2010-0097831

(51) Int. Cl.
*G11C 11/34* (2006.01)
(52) U.S. Cl.
USPC ............ 365/185.12; 365/185.11; 365/185.13; 365/235; 365/96
(58) Field of Classification Search
USPC .................. 365/185.11, 185.12, 185.13, 235, 365/96
See application file for complete search history.

(56) References Cited

U.S. PATENT DOCUMENTS

| 5,793,676 | A | 8/1998 | Bedarida et al. | |
|---|---|---|---|---|
| 6,591,327 | B1 | 7/2003 | Briner et al. | |
| 2002/0044486 | A1 * | 4/2002 | Chan et al. | 365/185.33 |
| 2007/0121385 | A1 * | 5/2007 | Futatsuyama | 365/185.23 |
| 2010/0172179 | A1 * | 7/2010 | Gorobets et al. | 365/185.09 |

FOREIGN PATENT DOCUMENTS

KR 20000070274 11/2000

* cited by examiner

*Primary Examiner* — Vu Le
*Assistant Examiner* — Han Yang
(74) *Attorney, Agent, or Firm* — Harness, Dickey & Pierce, P.L.C.

(57) ABSTRACT

A non-volatile memory device includes a first sector including a first sector selection transistor and a first plurality of pages connected to the first sector selection transistor, and a second sector including a second sector selection transistor and a second plurality of pages connected to the second sector selection transistor. Each of the first and second plurality of pages includes a memory transistor and a selection transistor, and a number of pages in the first plurality of pages is greater than a number of pages in the second plurality of pages.

9 Claims, 11 Drawing Sheets

NON-VOLATILE MEMORY DEVICE

CROSS-REFERENCE TO RELATED APPLICATION

This application claims priority under 35 U.S.C. §119 to Korean Patent Application No. 10-2010-0097831 filed on Oct. 7, 2010 in the Korean Intellectual Property Office (KIPO), the entire contents of which are incorporated herein by reference.

BACKGROUND

1. Field

At least some example embodiments relate to a non-volatile memory device.

2. Description of the Related Art

Semiconductor memory devices may be largely classified into volatile memory devices and non-volatile memory devices. The volatile memory devices can perform data read/write operations quickly, but they lose data when an external power supply is interrupted. On the other hand, the non-volatile memory devices can store data even when the external power supply is interrupted. Accordingly, the non-volatile memory devices are used to store data regardless of power supply. As examples of the non-volatile memory devices, there are a mask read-only memory (MROM), a programmable read-only memory (PROM), an erasable programmable read-only memory (EPROM), an electrically erasable programmable read-only memory (EEPROM) and the like.

SUMMARY

At least one example embodiment provides a non-volatile memory device with improved reliability.

Other objects of at least some example embodiments will be described in or be apparent from the following description of the embodiments.

According to an aspect of at least one example embodiment, there is provided a non-volatile memory device including a first sector including a first sector selection transistor and a first plurality of pages connected to the first sector selection transistor; and a second sector including a second sector selection transistor and a second plurality of pages connected to the second sector selection transistor, wherein each of the first and second plurality of pages includes a memory transistor and a selection transistor, and a number of pages in the first plurality of pages is greater than a number of pages in the second plurality of pages.

According to at least one example embodiment, there is provided a non-volatile memory device including a first sector including a first sector selection transistor and a first plurality of pages connected to the first sector selection transistor; a second sector including a second sector selection transistor and a second plurality pages connected to the second sector selection transistor; and a control unit configured to apply an enable signal to each of the first and second pluralities of pages through word lines, wherein the control unit is configured to apply the enable signal to only some of the second plurality pages through the word lines.

According to at least one example embodiment, there is provided a non-volatile memory device including a first sector including a first sector selection transistor and a first plurality of pages connected to the first sector selection transistor; a second sector including a second sector selection transistor and a second plurality of pages connected to the second sector selection transistor; a third sector including a third sector selection transistor and a third plurality of pages connected to the third sector selection transistor; a fourth sector including a fourth sector selection transistor and a fourth plurality of pages connected to the fourth sector selection transistor; and a control unit configured to apply an enable signal to each of the first through fourth pluralities of pages through word lines, wherein a number of pages of the first plurality of pages is equal to a number of pages of the second plurality of pages, a number of pages of the third plurality of pages is equal to a number of pages of the fourth plurality of pages, the number of the pages of the third sector being smaller than the number of the pages of the first sector, and the control unit is configured to apply the enable signal to only some of the pages included in the second and fourth pluralities of pages through the word lines.

According to at least one example embodiment, a memory apparatus includes a memory device, the memory device including first and second sectors, each of the first and second sectors including a plurality of memory pages, each of the plurality of memory pages including at least one memory transistor and at least one page selection transistor, and a sector selection transistor configured to select pages from among the plurality of pages; and a memory controller configured to selectively control the memory device to store data in one of the first sector or the second sector based on whether or not the data is operation data.

Other example embodiments are included in the detailed description and drawings.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
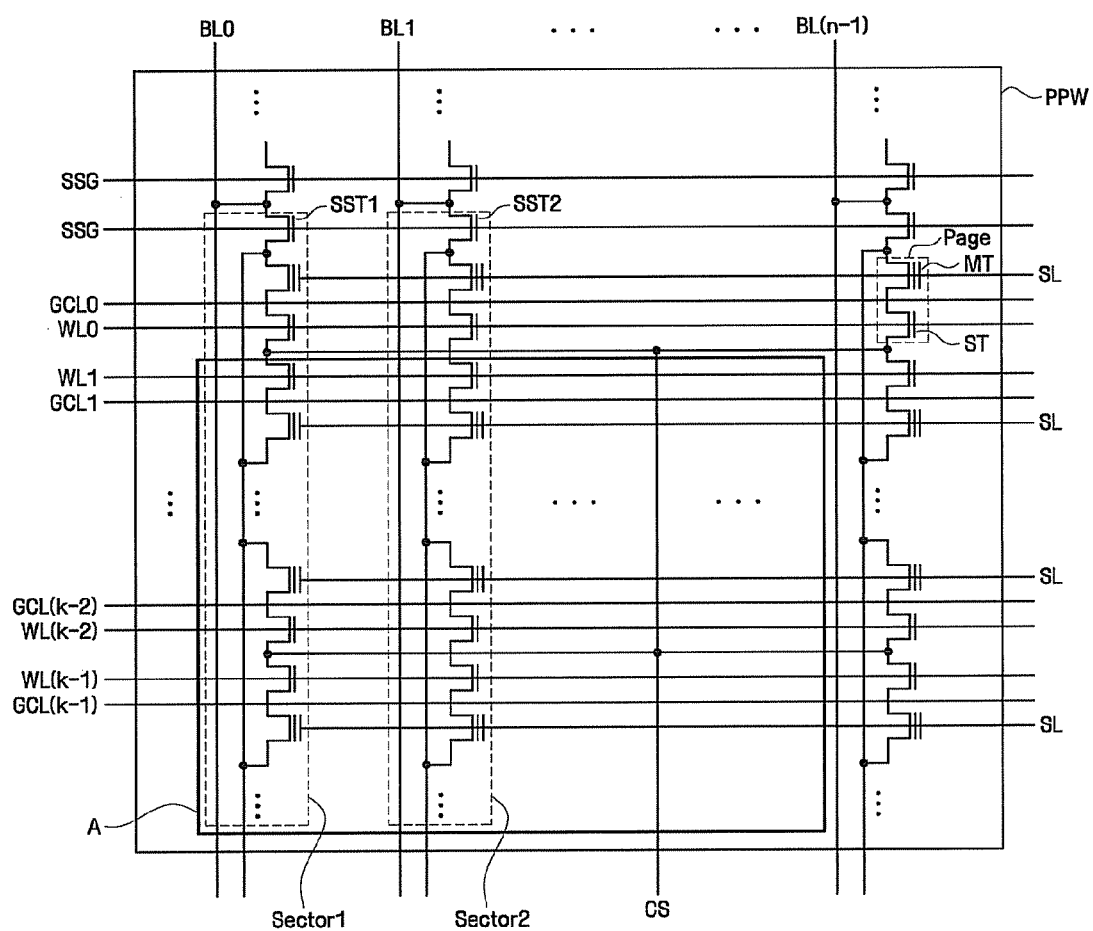
FIG. 1 is an exemplary diagram for explaining an overall circuit configuration of a non-volatile memory device.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Hereinafter, non-volatile memory devices in accordance with at least one example embodiment and modification examples thereof will be described with reference to FIGS. 1 to 7.

Figure 2:
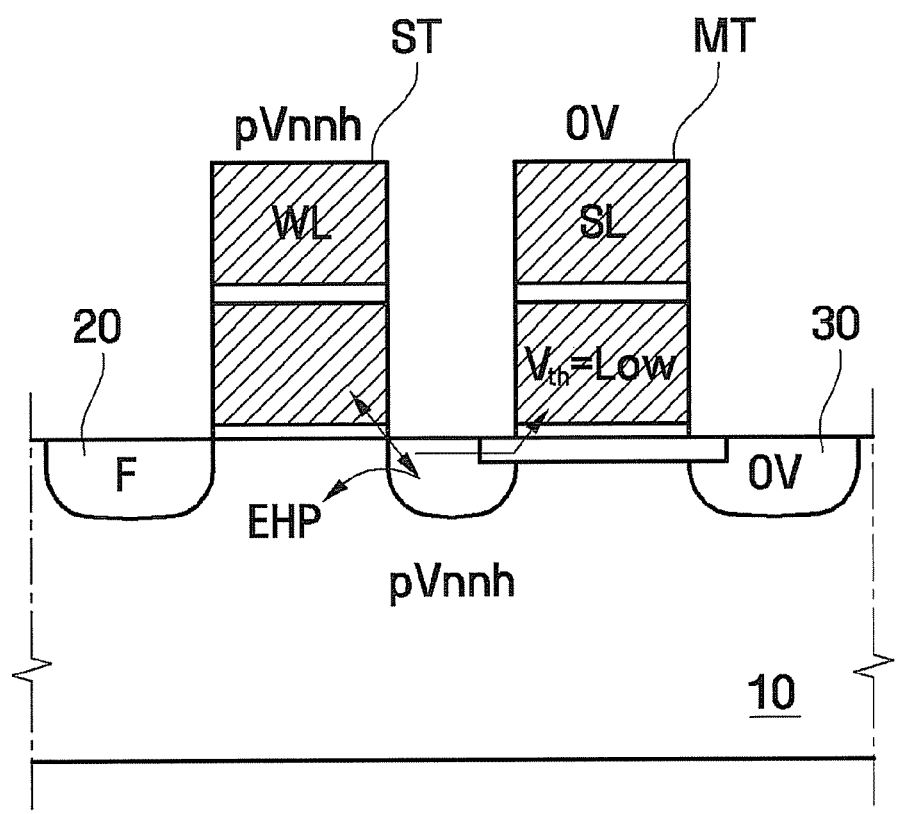
FIGS. 2 and 3 are diagrams for explaining disturbance generated in program/erase operations of the non-volatile memory device of FIG. 1.
Figure 3:
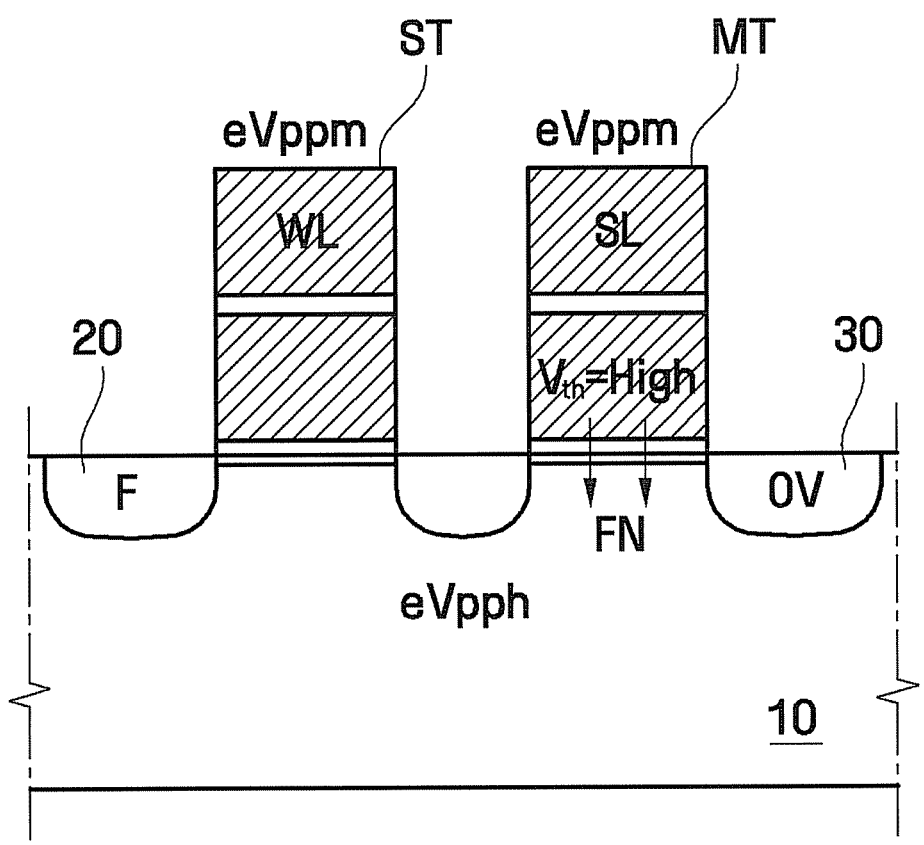
Figure 4:
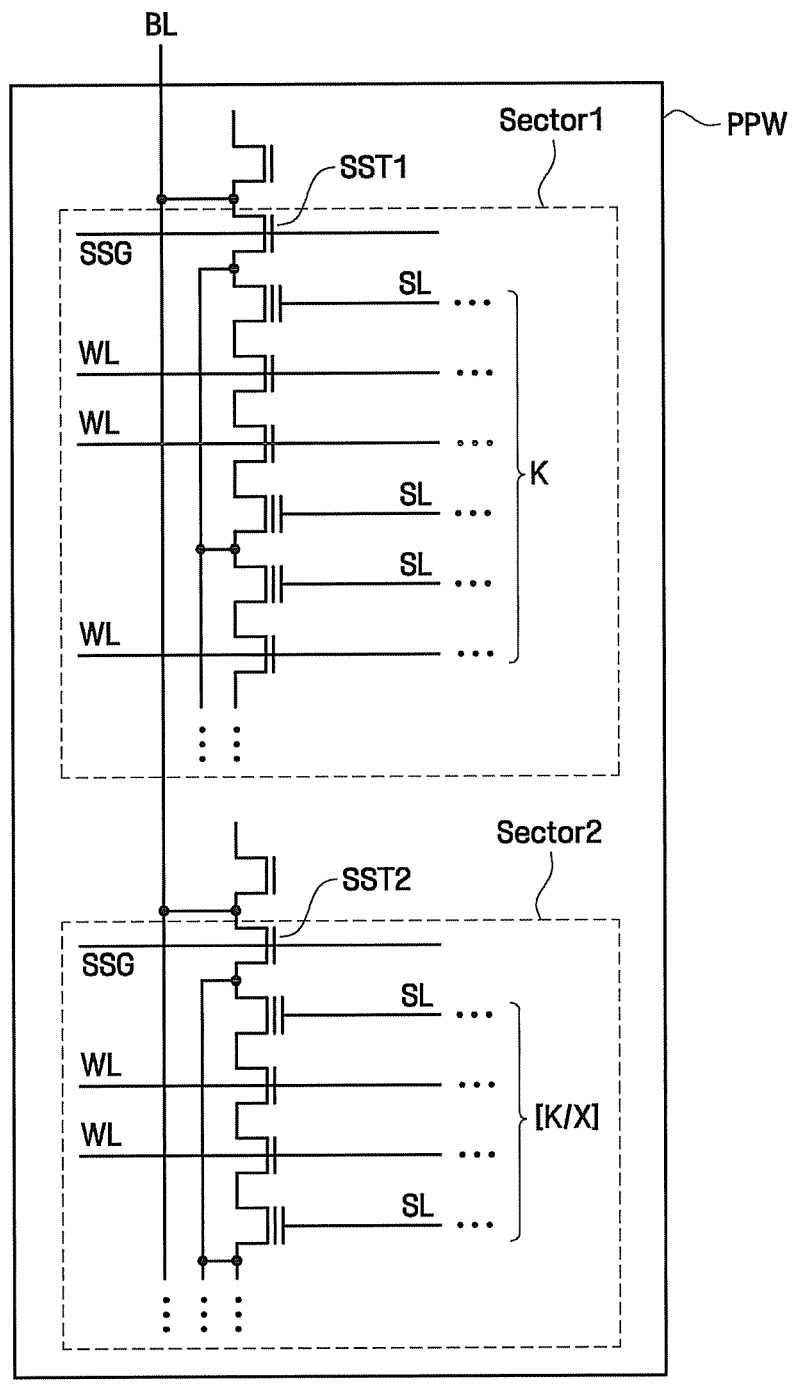
FIG. 4 is a conceptual diagram of a non-volatile memory device in accordance with at least one example embodiment.
Figure 5:
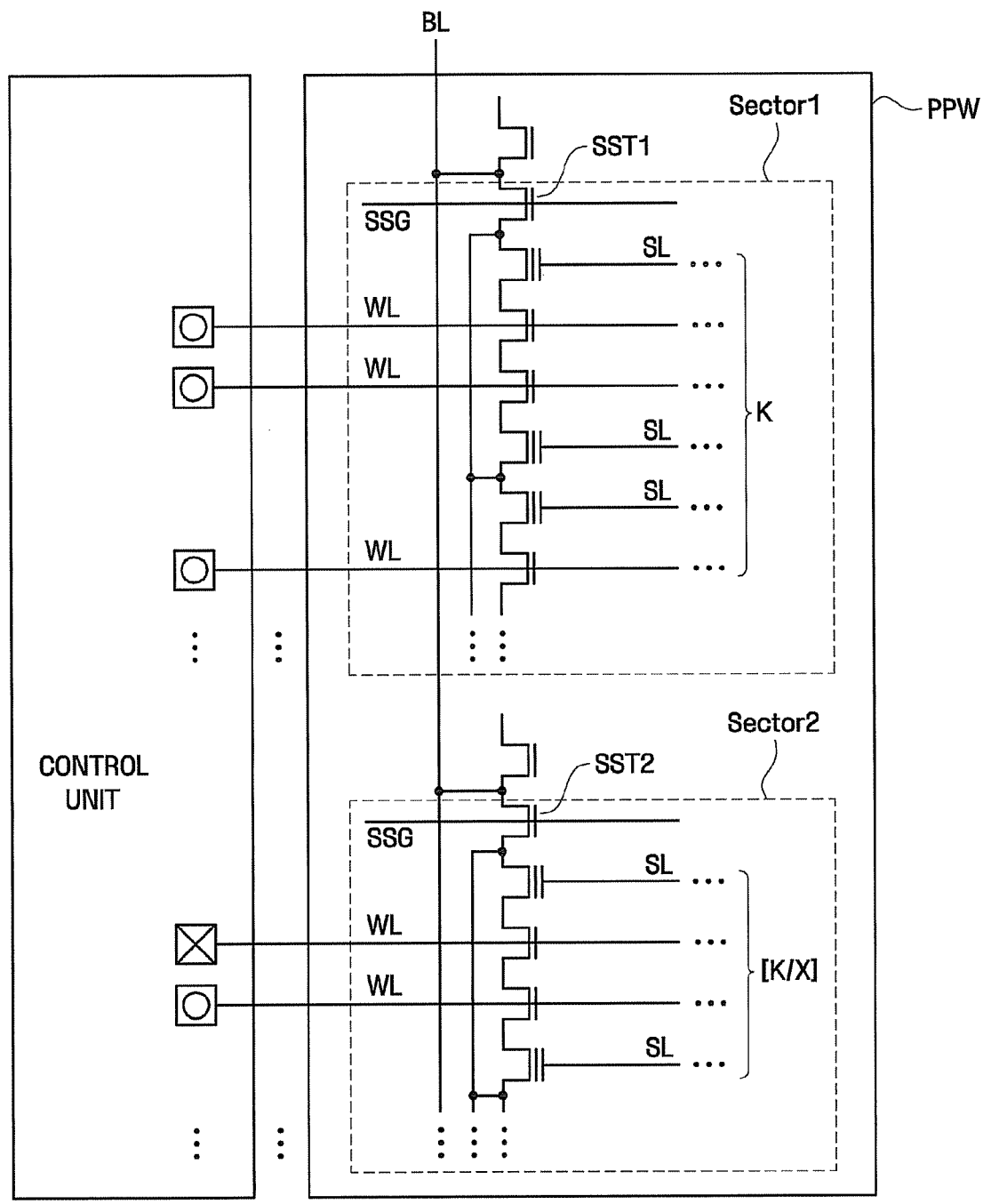
FIGS. 5 to 7 are conceptual diagrams of non-volatile memory devices in accordance with modification examples of at least one example embodiment.
Figure 6:
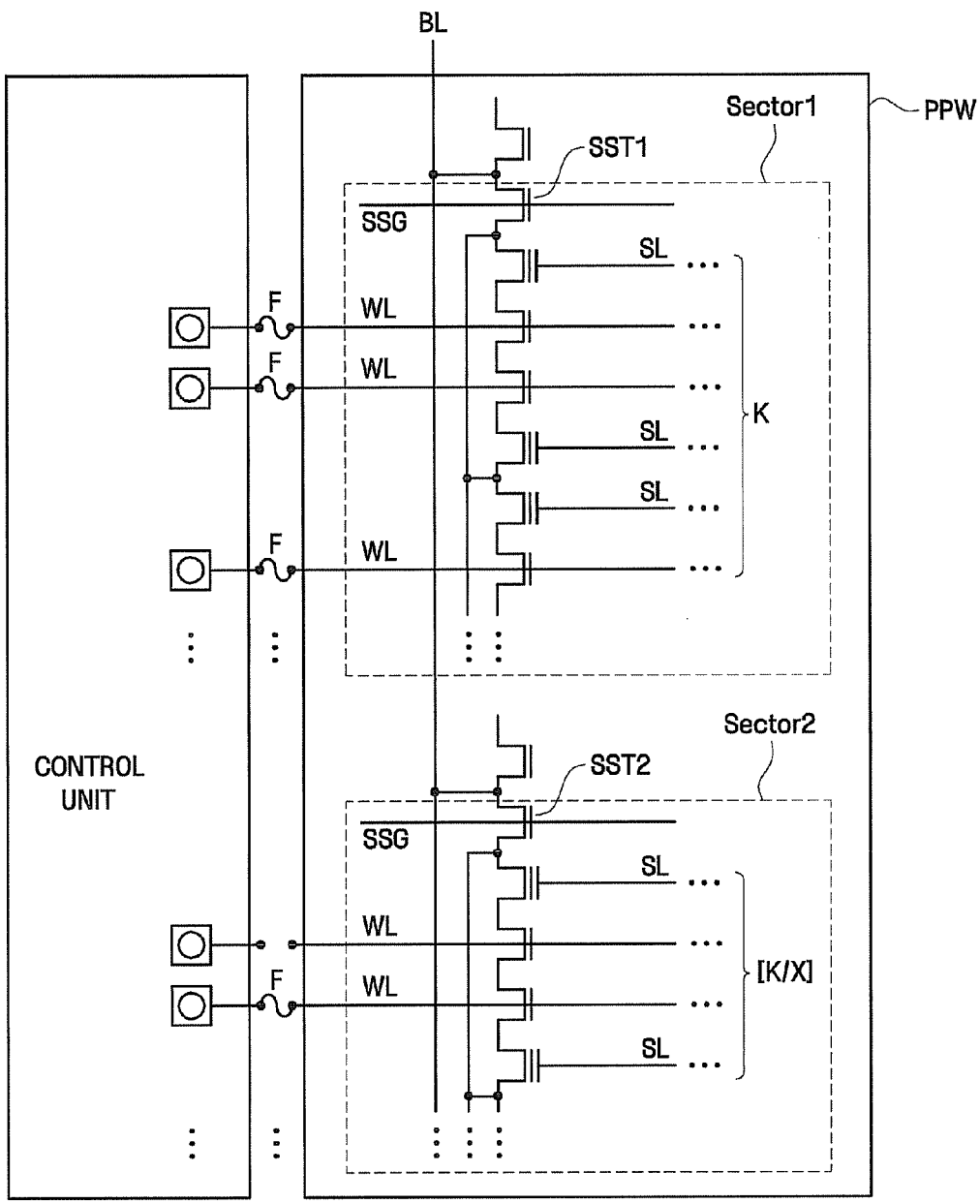
Figure 7:
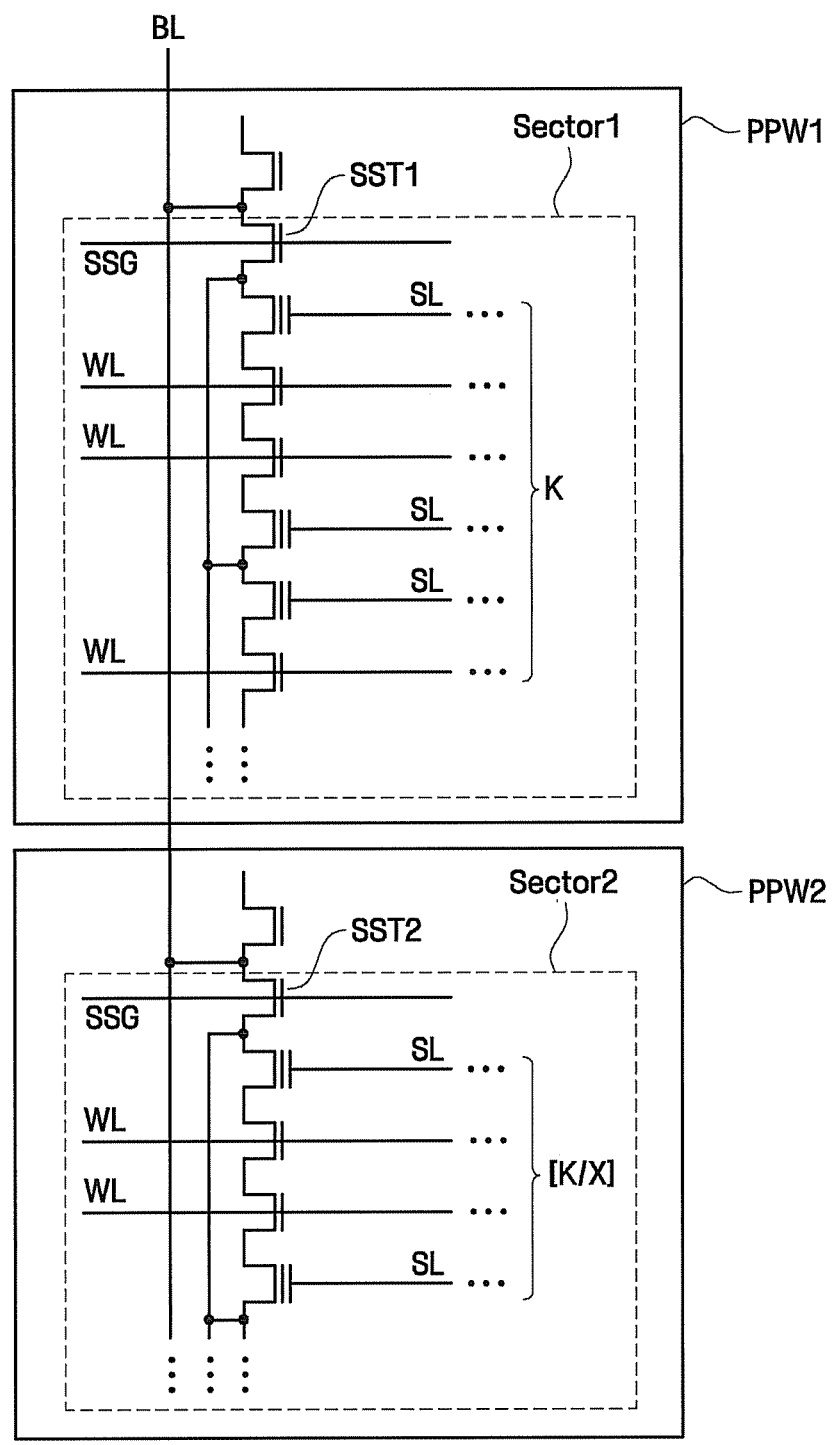

FIG. 1 is an exemplary diagram for explaining an overall circuit configuration of a non-volatile memory device. FIGS. 2 and 3 are diagrams for explaining disturbance generated in program/erase operations of the non-volatile memory device of FIG. 1. FIG. 4 is a conceptual diagram of a non-volatile memory device in accordance with at least one example embodiment. FIGS. 5 to 7 are conceptual diagrams of non-volatile memory devices in accordance with modification examples of at least one example embodiment.

Although a two-transistor (2T)-Fowler-Nordheim (FN)-NOR memory is described as an example of a non-volatile memory device in at least one example embodiment, at least some example embodiments are not limited thereto.

FIG. 1 illustrates an exemplary array structure of a 2T-FN-NOR memory capable of performing switching between K pages using one sector selection transistor SST1 or SST2.

Herein, "page" means a unit configured as a memory transistor MT and a selection transistor ST connected in series to the memory transistor MT.

The memory transistor MT forming a page is a substantially data storage element, which may include a floating gate serving as a charge storage region. Each page may be programmed by injecting electric charges in the floating gate by Fowler-Nordheim (F-N) tunneling, and erased by discharging the electric charges injected in the floating gate by F-N tunneling. The floating gate may be configured as a single gate or stack gate. A control gate may be formed on the floating gate. The control gates of the memory transistors MT arranged at the same page position may be connected in common to a selection line SL. Meanwhile, the selection transistor ST may include a selection gate to control activation of the memory transistor MT corresponding to the selection transistor ST. The selection gates of the selection transistors ST aligned in the same page line may be connected in common to the corresponding one of word lines WL0 to WL(K-1).

In this case, the sector may be enabled by one sector selection transistor SST1 or SST2, and include a plurality of pages connected to the sector selection transistor SST1 or SST2. In other words, referring to FIG. 1, a first sector Sector1 may be enabled by a first sector selection transistor SST1, and include a plurality of pages connected in series to the first sector selection transistor SST1. Further, a second sector Sector2 may be enabled by a second sector selection transistor SST2, and include a plurality of pages connected in series to the second sector selection transistor SST2.

The sector selection transistor SST1 (or SST2) may be controlled by a sector selection gate SSG, and serve to provide a signal of a bit line BL0 (or BL1) to the pages forming the sector Sector1 (or Sector2). For example, if the first sector selection transistor SST1 is turned on by the sector selection gate SSG, a signal of the bit line BL0 may be applied to the pages included in the first sector Sector1 such that the first sector Sector1 is enabled.

Meanwhile, a common source line CS may be connected to a source of the selection transistor ST. Further, a local bit line branched from the sector selection transistor SST1 or SST2 may be connected to a drain of the memory transistor MT. Although not shown, an additional transistor (not shown) connecting the selection line SL with a global control line GCL may be provided so as to program all pages in a first well PPW.

Next, a case of programming a specific page (represented by "Page" in FIG. 1) will be described with reference to FIGS. 1 and 2. In order to program the specific page by F-N tunneling, the following operations may be performed on those associated with the specific page: a voltage pVnnh (e.g., -5 V) is applied to a bit line BL(n-1), a voltage pVnnh (e.g., -5 V) is applied to the first well PPW of FIG. 1, a voltage pVnnh (e.g., 11 V) is applied to the selection line SL, a voltage pVnnh (e.g., -5 V) is applied to the word line WL0, and a source of the selection transistor ST is made to be in a floating state. In this case, electrons of a channel formed in the first well PPW are injected in the floating gate by F-N tunneling, thereby programming the specific page.

In this case, in order to prevent other pages from being programmed, the following operations may be performed on those which are not associated with the specific page: a ground voltage (e.g., 0 V) is applied to bit lines BL0 to BL(n-2) (represented by reference numeral 30 of FIG. 2) and the selection line SL, a voltage pVnnh (e.g., -5 V) is applied to the first well PPW of FIG. 1 (represented by reference numeral 10 of FIG. 2), a voltage pVnnh (e.g., -5 V) is applied to word lines WL1 to WL(k-1), and a source (represented by reference numeral 20 of FIG. 2) of the selection transistor ST is made to be in a floating state. In this case, in pages included in a region A of FIG. 1 which should not be programmed, electrons are injected in the floating gate due to a voltage difference between the first well 10 and the selection line SL as shown in FIG. 2, thereby causing program disturbance.

Next, a case of erasing a specific page (represented by "Page" in FIG. 1) will be described with reference to FIGS. 1 and 3. In order to erase the specific page by F-N tunneling, the following operations may be performed on those associated with the specific page: the bit line BL(n-1) and the source of the selection transistor ST are made to be in a floating state, a voltage eVnnh (e.g., 10 V) is applied to the first well PPW of FIG. 1, a voltage eVnnh (e.g., -6 V) is applied to the selection line SL, and a voltage eVnnm (e.g., 6 V) is applied to the word line WL0. In this case, electrons injected in the floating gate flow into the channel formed in the first well PPW, thereby erasing the specific page.

In this case, in order to prevent other pages from being erased, the following operations may be performed on those which are not associated with the specific page: the bit lines BL0 to BL(n-2) (represented by reference numeral 30 of FIG. 3) and the source (represented by reference numeral 20 of FIG. 3) of the selection transistor ST are made to be in a floating state, a voltage eVnnh (e.g., 10 V) is applied to the first well PPW of FIG. 1 (represented by reference numeral 10 of FIG. 3), and a voltage eVnnm (e.g., 6 V) is applied to the selection line SL. In this case, in pages included in the first well PPW of FIG. 1 which should not be erased, electrons are emitted from the floating gate due to a voltage difference between the first well 10 and the selection line SL as shown in FIG. 3, thereby causing erase disturbance.

When the program disturbance and the erase disturbance frequently occur due to repeated program/erase operations, it may have a bad influence on the reliability of the non-volatile memory device. For instance, if a specific sector is a sector storing code data, since the code data may not require frequent program/erase operations due to the nature of the code data, the program/erase disturbance may not frequently occur. However, if a specific sector is a sector storing operation data, since the operation data may require frequent program/erase operations due to the nature of the operation data, the program/erase disturbance frequently occurs, and it may have a bad influence on the reliability of the non-volatile memory device.

Referring to FIG. 4, the non-volatile memory device in accordance with at least one example embodiment may include the first sector Sector1 which is enabled by the first sector selection transistor SST1 and has a plurality of pages connected to the first sector selection transistor SST1, and the second sector Sector2 which is enabled by the second sector selection transistor SST2 and has a plurality of pages connected to the second sector selection transistor SST2. In this case, each page may include the memory transistor and the selection transistor as described above, and the first sector Sector1 and the second sector Sector2 may be formed in the same well, i.e., the first well PPW. Further, the first and second sector selection transistors SST1 and SST2 may be enabled according to a signal of the sector selection gate SSG.

Meanwhile, the number of pages of the first sector Sector1 may be greater than the number of pages of the second sector Sector2. Specifically, as shown in FIG. 4, the number of pages of the first sector Sector1 may be, e.g., K, and the number of pages of the second sector Sector2 may be, e.g., function $f(K/X)$ where $f(A)$ is a maximum value among natural numbers smaller than A; and X is less than K and greater than 1. Also, X may be adjusted by a user if necessary. K and X may be, for example, positive integers.

In the non-volatile memory device in accordance with at least one example embodiment, the first sector Sector1 may be a sector storing the code data, and the second sector Sector2 may be a sector storing the operation data. That is, it is possible to minimize the program disturbance by reducing the number of pages of the second sector Sector2 in which the program operation frequently occurs, thereby improving the reliability of the non-volatile memory device.

Next, referring to FIG. 5, a non-volatile memory device in accordance with a first modification example of at least one example embodiment may further include a control unit which applies an enable signal to each page through the word lines WL.

The control unit may apply an enable signal to only some of pages included in the second sector Sector2 through the word lines WL. Accordingly, a signal of the word lines WL may be applied to only some of [K/X] pages. That is, an enable signal is not applied through the word line WL to the nearest page to the second sector selection transistor SST2 among the pages of the second sector Sector2 of FIG. 5 and, thus, the page is not used (see "X" represented in FIG. 5). On the other hand, an enable signal is applied through the word line WL to the next page and, thus, the page is used (see "O" represented in FIG. 5). In other words, the control unit may apply an enable signal so as to use only some pages among [K/X] pages of the second sector Sector2. The operation of the control unit may be performed by a previously programmed logic (not shown). Alternatively, the control unit may be provided with a page counter (not shown) such that a specific page is not used if the number of program operations performed on the specific page is equal to or larger than a predetermined value.

As described above, in a case where the non-volatile memory device further includes the control unit, it is possible to more efficiently reduce the program disturbance than the non-volatile memory device in accordance with at least one example embodiment, thereby enhancing the reliability of the non-volatile memory device.

Next, referring to FIG. 6, a non-volatile memory device in accordance with a second modification example of at least one example embodiment may further include a plurality of fuses F connected to the word lines WL. In this case, the control unit does not control the operations of pages and whether to use a specific page may be determined by the fuses F connected to the word lines WL. Specifically, referring to FIG. 6, although the control unit is set to use all pages of the first and second sectors Sector1 and Sector2 (see "O" represented in FIG. 6), at least one of the fuses F, which are connected through the word lines WL to some of the pages included in the second sector Sector2, is cut off. Accordingly, the page, to which a signal is not applied through the word line WL because the fuse F is cut off, cannot be used as a memory. Thus, only some pages among [K/X] pages included in the second sector Sector2 are used.

Although the control unit is set to use all pages in the example of FIG. 6, the first modification example and the second modification example can be combined with each other. That is, in the second sector Sector2, some pages may be controlled by using the control unit and some pages may be controlled by using the fuses F. Although not shown in the drawings, the non-volatile memory device may further include a third sector (not shown) which is enabled by a third sector selection transistor (not shown) and has a plurality of pages connected to the third sector selection transistor, and the number of pages of the third sector (not shown) may be [K/X] equal to the number of pages of the second sector Sector2. In this case, some pages among the [K/X] pages included in the second sector Sector2 are used by the control unit or the fuses F, whereas all of the [K/X] pages included in the third sector Sector3 may be used. In this case, all of K pages of the first sector Sector1 may be used, some pages among [K/X] pages of the second sector Sector2 may be used, and all of [K/X] pages of the third sector (not shown) may be used.

Next, referring to FIG. 7, a non-volatile memory device in accordance with a third modification example of at least one example embodiment may include a first sector Sector1 and a second sector Sector2 which are formed in different wells. That is, as shown in FIG. 7, the first sector Sector1 may be formed in a first well PPW1 and the second sector Sector2 may be formed in a second well PPW2. When the first sector Sector1 and the second sector Sector2 are formed in different wells, the erase disturbance can be reduced. Specifically, the second sector Sector2 is a sector storing operation data, in which the erase operation may frequently occur. On the other hand, the first sector Sector1 is a sector storing code data, in which the erase operation does not frequently occur. Accordingly, when the first sector Sector1 and the second sector Sector2 are formed in different wells, it is possible to reduce the disturbance which the first sector Sector1 undergoes from the frequent erase operations of the second sector Sector2.

In the same way as the above, all of the embodiment and modification examples can be variously combined with each other. Since those skilled in the art can understand this from the above description, a description of specific and detailed combinations will be omitted.

Next, non-volatile memory devices in accordance with at least one example embodiment and a modification example thereof will be described with reference to FIGS. 8 and 9.

Figure 8:
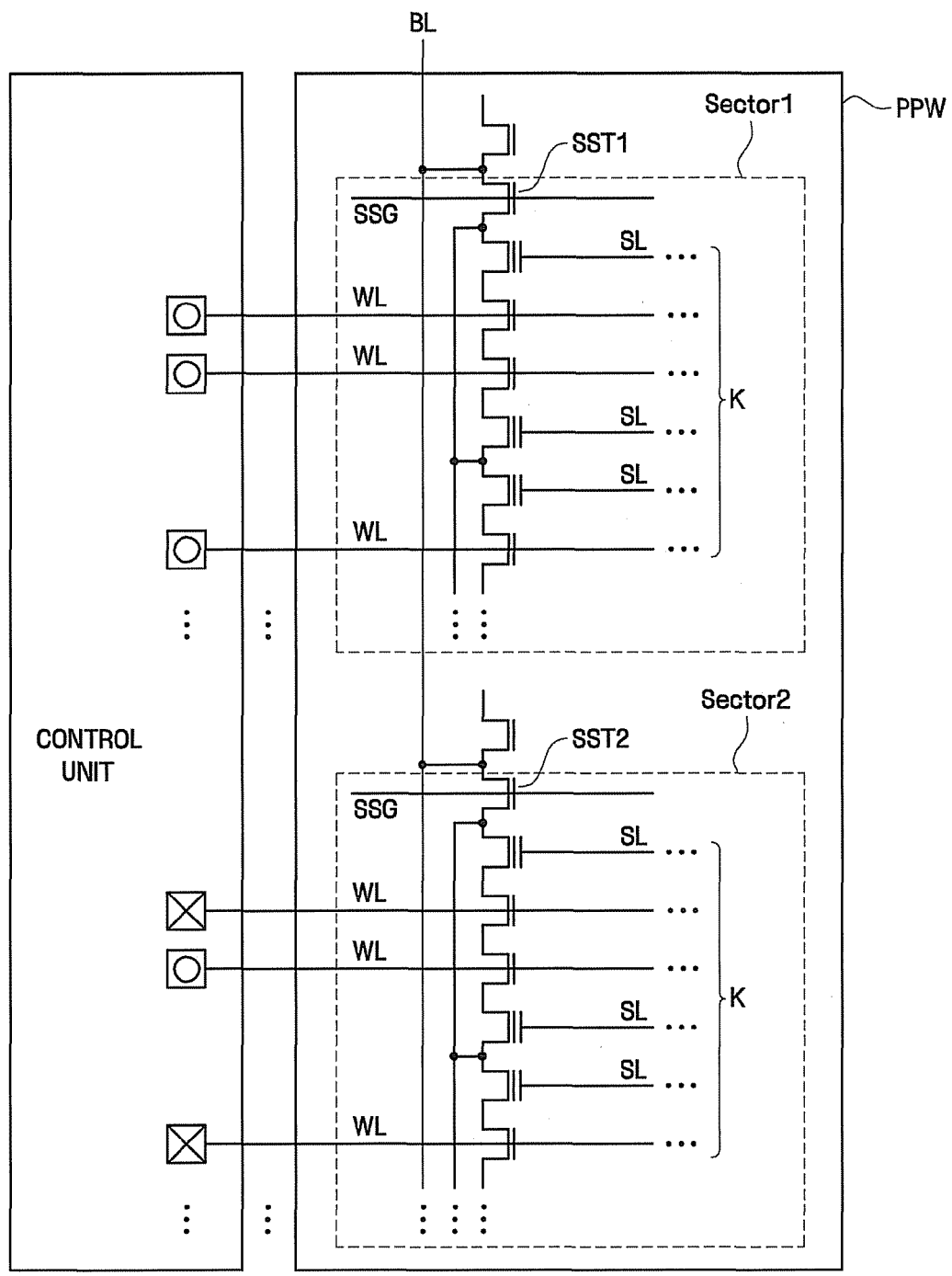
FIG. 8 is a conceptual diagram of a non-volatile memory device in accordance with at least one example embodiment.

FIG. 8 is a conceptual diagram of a non-volatile memory device in accordance with at least one example embodiment. FIG. 9 is a conceptual diagram of a non-volatile memory device in accordance with a modification example of at least one example embodiment. For convenience of explanation, only differences from the above embodiment will be described and a repeated description will be omitted.

Referring to FIG. 8, the non-volatile memory device in accordance with at least one example embodiment includes the first sector Sector1 and the second sector Sector2, each sector having K pages. Further, the control unit controls a signal of the word lines WL so as to use only some pages among K pages of the second sector Sector2 (see "O" and "X" represented in FIG. 8). Accordingly, the second sector Sector2 has K pages, but only some pages of the K pages are used. In this case, a reduction of program disturbance of the non-volatile memory device is described in detail above and, thus, a repeated description thereof will be omitted.

Figure 9:
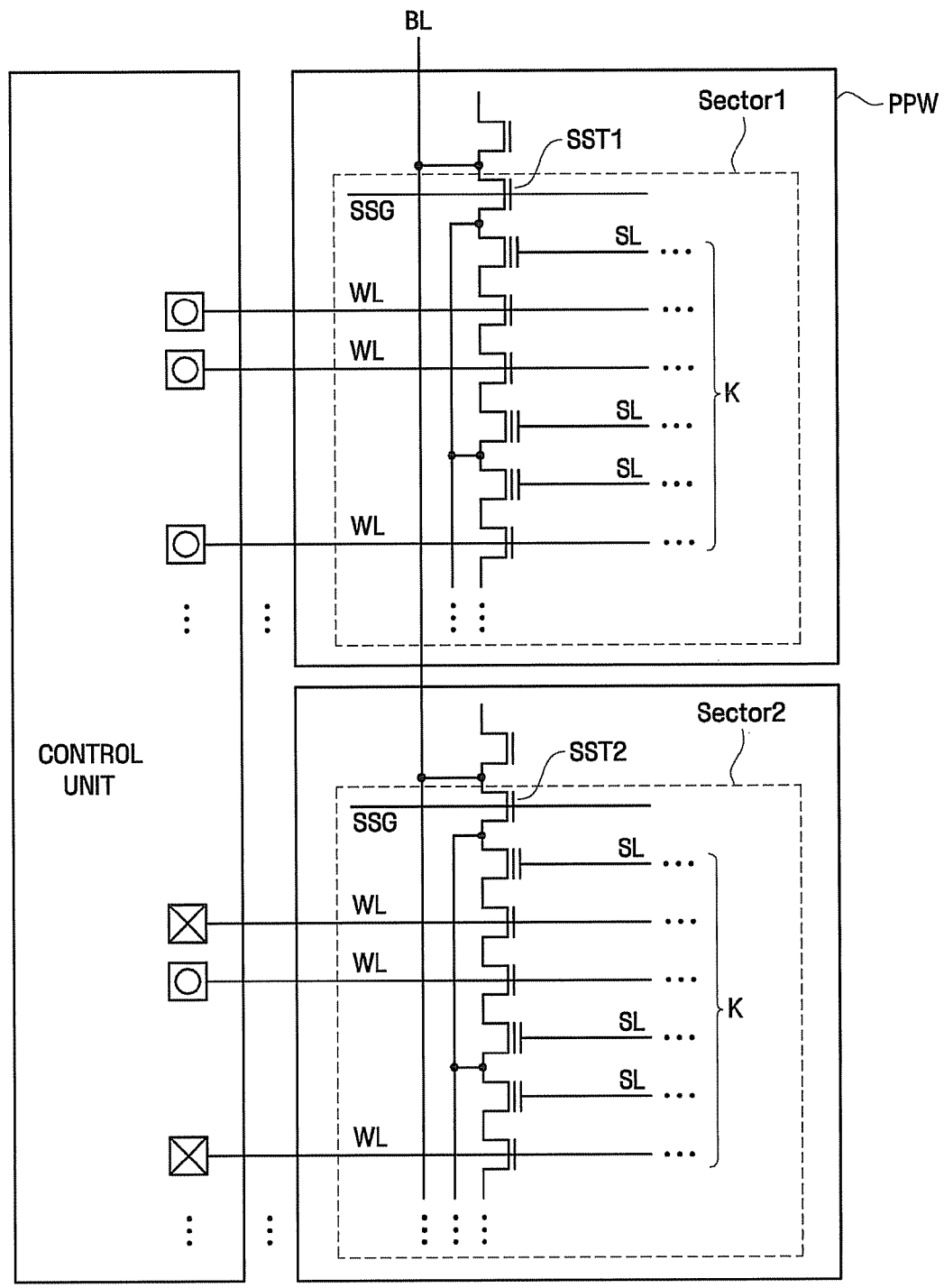
FIG. 9 is a conceptual diagram of a non-volatile memory device in accordance with a modification example of at least one example embodiment.

Next, referring to FIG. 9, a non-volatile memory device in accordance with a modification example of at least one example embodiment includes the first sector Sector1 and the second sector Sector2 which are formed in different wells PPW1 and PPW2. In this case, a reduction of program disturbance of the non-volatile memory device is described in detail above and, thus, a repeated description thereof will be omitted.

In the same way as the above, all of the embodiments and modification examples can be variously combined with each other. For instance, a non-volatile memory device in accordance with at least one example embodiment may include a first sector which is enabled by a first sector selection transistor and has a plurality of pages connected to the first sector selection transistor, a second sector which is enabled by a second sector selection transistor and has a plurality of pages connected to the second sector selection transistor, a third sector which is enabled by a third sector selection transistor and has a plurality of pages connected to the third sector selection transistor, a fourth sector which is enabled by a fourth sector selection transistor and has a plurality of pages connected to the fourth sector selection transistor, and a control unit which applies an enable signal to each page through word lines, wherein the first sector and the second sector have the same number (i.e., K) of pages, the third sector and the fourth sector have the same number of (i.e., [K/X]) of pages, and the control unit applies an enable signal to only some pages among the pages included in the second and fourth sectors through the word lines.

Next, an application example of the non-volatile memory device fabricated in accordance with at least one example embodiment will be described with reference to FIGS. 10 to 12.

Figure 10:
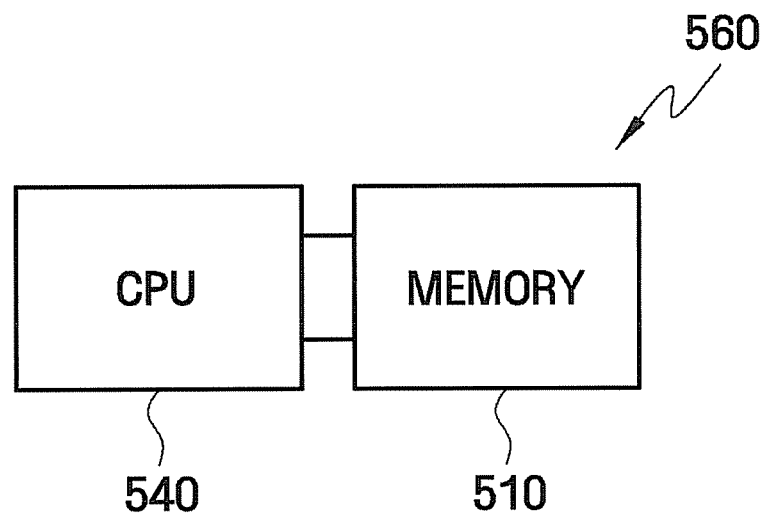
FIGS. 10 to 12 are diagrams for explaining an application example of the non-volatile memory device fabricated in accordance with at least one example embodiment.
Figure 11:
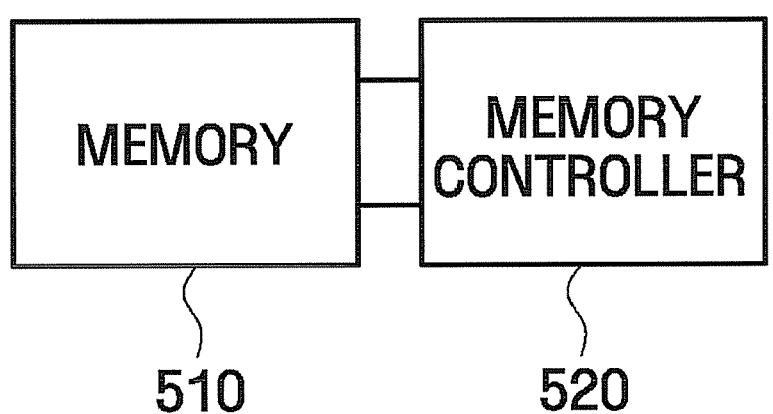
Figure 12:
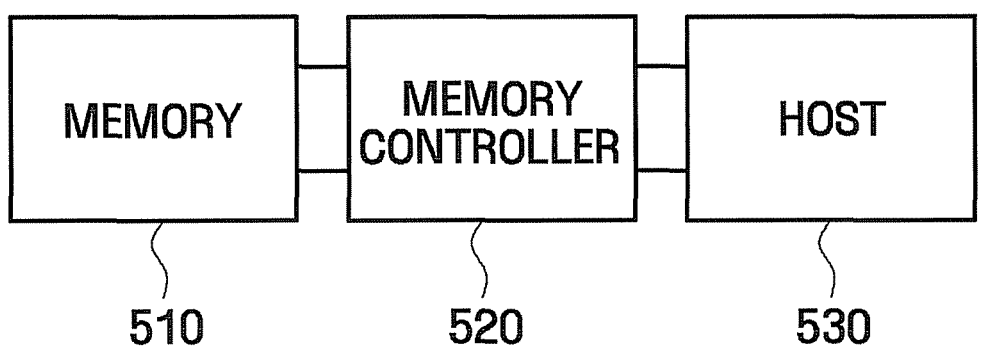

FIGS. 10 to 12 are diagrams for explaining an application example of the non-volatile memory device fabricated in accordance with at least one example embodiment. In the examples illustrated in FIGS. 10-12, a memory 510 may be a non-volatile memory device fabricated in accordance with any one aforementioned example embodiments, including the example embodiments referenced with respect to FIGS. 1 and 4-9 which are directed to memory devices that may provide improved reliability as described above.

Referring to FIG. 10, a system in accordance with at least one example embodiment includes a memory 510 and a memory controller 520 connected to the memory 510. The memory controller 520 may provide an input signal for controlling an operation of the memory 510, e.g., a command signal and an address signal for controlling a read operation and a write operation, to the memory 510. Further the memory controller 520 may be configured such that operation data is stored in Sector 2 of the memory 510 and non-operation data, e.g. coding data, is stored in Sector 1 of the memory 510.

The system including the memory 510 and the memory controller 520 may be embodied in a card such as a memory card. Specifically, the system in accordance with at least one example embodiment may be embodied in a card which satisfies a specified industry standard and is used in an electronic device such as a mobile phone, a two-way communication system, a one-way pager, a two-way pager, a personal communication system, a portable computer, a personal data assistant (PDA), an audio and/or video player, a digital and/or video camera, a navigation system, a global positioning system (GPS), and the like. However, it is not limited thereto, and the system in accordance with at least one example embodiment may be embodied in various forms such as a memory stick.

Referring to FIG. 11, a system in accordance with at least one example embodiment may include a memory 510, a memory controller 520, and a host system 530. In this case, the host system 530 may be connected to the memory controller 520 via a bus and the like, and provide a control signal to the memory controller 520, so that the memory controller 520 can control an operation of the memory 510. The host system 530 may be, for example, a processing system used in a mobile phone, a two-way radio communication system, a one-way pager, a two-way pager, a personal communication system, a portable computer, a PDA, an audio and/or video player, a digital and/or video camera, a navigation system, a GPS, and the like.

Meanwhile, although the memory controller 520 is interposed between the memory 510 and the host system 530 in FIG. 11, it is not limited thereto, and the memory controller 520 may be selectively omitted in a system in accordance with at least one example embodiment. Further one or both of the host system 530 and the memory controller 520 may be configured such that operation data is stored in Sector 2 of the memory 510 and non-operation data, e.g. coding data, is stored in Sector 1 of the memory 510. Further the host system 530 is capable of indicating to the memory controller 520 whether data to be stored in the memory 510 is operation data or non-operation data.

Referring to FIG. 12, a system in accordance with at least one example embodiment may be a computer system 560 including a central processing unit (CPU) 540 and a memory 510. In the computer system 560, the memory 510 may be connected to the CPU 540 directly or using a typical computer bus architecture. The memory 510 may store an operation system (OS) instruction set, a basic input/output start up (BIOS) instruction set, an advanced configuration and power interface (ACPI) instruction set and the like, or may be used as a large-capacity storage device such as a solid state disk (SSD).

For convenience of explanation, all constituent elements included in the computer system 560 are not illustrated in FIG. 12, but it is not limited thereto. Further, for convenience of explanation, the memory controller 520 is omitted between the memory 510 and the CPU 540 in FIG. 12. However, the memory controller 520 may be interposed between the memory 510 and the CPU 540 in at least one example embodiment. Further one or both of the memory controller 520 and the CPU 540 may be configured such that operation data is stored in Sector 2 of the memory 510 and non-operation data, e.g. coding data, is stored in Sector 1 of the memory 510.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A non-volatile memory device comprising:
a first sector including a first sector selection transistor and a first plurality of pages connected to the first sector selection transistor; and
a second sector including a second sector selection transistor and a second plurality of pages connected to the second sector selection transistor,
wherein each of the first and second plurality of pages includes a memory transistor and a selection transistor, and a number of pages in the first plurality of pages is greater than a number of pages in the second plurality of pages.

2. The non-volatile memory device of claim 1, wherein the first sector and the second sector are formed in a first well.

3. The non-volatile memory device of claim 2, wherein the number of the pages of the first plurality of pages is K, and the number of the pages of the second plurality of pages is defined by f(K/X), where f(A) is a maximum value among natural numbers smaller than A, and X is less than K and greater than 1.

4. The non-volatile memory device of claim 3, wherein the first sector is a sector storing code data, and the second sector is a sector storing operation data.

5. The non-volatile memory device of claim 2, further comprising:
a control unit configured to apply an enable signal to each of the first and second pluralities of pages through word lines,
wherein the control unit applies the enable signal to only some of the second plurality of pages the word lines.

6. The non-volatile memory device of claim 5, further comprising:
fuses connected through the word lines to pages from among the first and second pluralities of pages,
wherein at least one of the fuses connected to a page from among the second plurality of pages is cut off.

7. The non-volatile memory device of claim 1, wherein the first sector is formed in a first well, and the second sector is formed in a second well different from the first well.

8. The non-volatile memory device of claim 7, wherein the number of the pages of the first sector is K, and the number of the pages of the second sector is f(K/X), where f(A) is a maximum value among natural numbers smaller than A and X is greater than 1.

9. The non-volatile memory device of claim 1, wherein the memory device is configured as a two-transistor (2T)-Fowler-Nordheim (FN)-NOR memory.

* * * * *